United States Patent

Seiler et al.

[11] Patent Number: 6,133,125
[45] Date of Patent: Oct. 17, 2000

[54] SELECTIVE AREA DIFFUSION CONTROL PROCESS

[75] Inventors: Joseph Brian Seiler, Penn Township, Berks County; Bryan Phillip Segner, Upper Macungie, Lehigh County; Michael Geva, Allentown; Cheng-Yu Tai, Upper Macungie Township, Lehigh County; Erin Kathleen Byrne, Lower Alsace Township, Berks County, all of Pa.

[73] Assignee: Lucent Technologies Inc., Murray Hill, N.J.

[21] Appl. No.: 09/226,399

[22] Filed: Jan. 6, 1999

[51] Int. Cl.[7] .................................................. H01L 21/22
[52] U.S. Cl. .............................. 438/549; 438/569; 438/47
[58] Field of Search ................................. 438/23, 45, 47, 438/549, 569, 923, FOR 314, FOR 465, FOR 498; 257/927

[56] References Cited

U.S. PATENT DOCUMENTS 4,374,867  2/1983  Nahory et al. .
5,580,818  12/1996  Sakata .
5,930,660  7/1999  Davis .

Primary Examiner—George Fourson
Assistant Examiner—Joannie A. Garcia
Attorney, Agent, or Firm—Darby & Darby

[57] ABSTRACT

A method for altering a dopant front profile of a dopant in a wafer is disclosed. An initial wafer is provided with an upper doped layer and a lower undoped layer. An oxide layer is grown over a portion of the wafer while a second portion of the wafer remains oxide-free. The wafer is then exposed to a substantially non-growth enhancement diffusion environment that contains the dopant at a given flow rate, but lacks additional materials which would cause growth on the exposed portions of wafer. After a predetermined amount of diffusion is allowed to occur, the wafer is removed from the diffusion environment and the oxide layer is removed.

11 Claims, 6 Drawing Sheets

SELECTIVE AREA DIFFUSION CONTROL PROCESS

TECHNICAL FIELD

This invention is related to a method for controlling the diffusion depth of a dopant into a substrate. More particularly, this invention relates to a method of altering the dopant front profile of a previously doped substrate in selected areas of the substrate while leaving the profile in the remaining areas substantially unchanged.

BACKGROUND OF THE INVENTION

Many types of electronic applications combine elements from two or more device classes. For example, in semiconductor laser applications, two separate devices are commonly utilized: a semiconductor laser, and an integrated modulator circuit. It is advantageous to combine the laser and the modulator component in a single opto-electronic package. However, because the two component classes have different device fabrication requirements, these elements are conventionally fabricated on separate wafers. In a typical device, both the modulator and the laser are fabricated on a semiconductor wafer with a zinc-doped indium gallium arsenide (InGaAs) cap layer and one or more layers of indium phosphate (InP) with various doping levels.

A critical difference between the fabrication requirements of each of these device classes, however, is the depth of the p/n junction, which itself is controlled by the depth of the zinc-dopant front profile. In particular, a semiconductor laser device requires the zinc doping to extend deeper into the substrate to reach the quantum well and confinement layer. In contrast, the electronic devices used in the modulator require a doping front which is comparatively shallow, extending only to the second confinement layer. In order to insure that the proper junction depth is achieved for each of these device classes, they are conventionally fabricated on separate substrates, each having a different doping profile.

Attempts have been made to produce opto-electronic devices of different classes on the same wafer. Conventional methods of combining such devices selectively control the junction depth by performing several masked diffusion steps, one for each different junction depth required. Each step adds dopant only to the regions of the wafer requiring the same junction depth. For example, a first diffusion step may be used to form the p/n junction for the semiconductor laser while the substrate regions designated to house the modulator components are protected by an oxide. After the diffusion step, the applied oxide is removed and a second oxide layer is applied over the area for housing the laser devices while leaving the area for modulator devices uncovered. A second diffusion step is then used to implant dopants in the modulator area at the required, different depth.

A significant drawback to this technique is the number of steps required. In particular, separate oxide layers must be selectively grown and then removed in order to introduce diffusion regions of differing depths. In addition, the increased number of processing steps results in migration of earlier introduced dopants, thus resulting in a less precisely fabricated device.

Accordingly, it would be advantageous to be able to produce a wafer having a dopant front profile which extends to different depths in different areas of the wafer without requiring several layers of oxide to be selectively placed and removed on the wafer. It would be also be advantageous to be able to produce a combined laser and modulator device on a single wafer and as part of a single chip, rather than producing each component on a separate chip and combining the separate chips within a single package.

SUMMARY OF THE INVENTION

According to the present invention, a selective area diffusion-control process is provided in which the diffusion front profile of the dopant in a semiconductor wafer is selectively altered to provide p/n junctions at two or more different depths. The wafer to be processed is initially prepared with one or more layers containing the relevant dopant above a lower sub-layer which contains a substantially lower amount of the dopant or is undoped. The boundary between the doped and undoped layers defines the initial location of the dopant front throughout the wafer. An oxide layer is grown over a first portion of the top of the wafer while a second portion remains oxide-free. The wafer is then exposed to a substantially non-growth enhancement diffusion environment which contains the desired dopant, but does not contain sufficient additional materials to cause material growth on the exposed portion of the wafer.

Because free dopants cannot enter the wafer through the oxide layer, the dopants which are under the oxide migrate only through thermal diffusion. However, in the exposed regions of the wafer, dopants enter the wafer and enhance the rate of diffusion. The concentration of the dopant in the enhancement environment determines the magnitude at which the rate of diffusion is enhanced and therefore, the speed at which the dopant front profile advances. When the diffusion rate is enhanced by a large amount, the dopant front profile under the exposed regions can be advanced a significant distance without substantial changes in the profile under the oxide.

Once the desired amount of diffusion has taken place, the oxide layer is removed from the wafer. Because the enhancement environment is non-growth, the original surface characteristics of the wafer are preserved. According to the invention, the enhanced diffusion of dopants in the exposed areas of the wafer provides a p/n junction depth which is deeper than the junction depth on the parts of the wafer which were covered by the oxide. When the fabrication parameters are appropriately controlled, the present method allows the dopant front profile to be selectively altered to produce a wafer with two or more different p/n junction depths, and therefore, allows for separate electronic devices such as semiconductor lasers and laser modulators to be fabricated on a single chip.

Since both diffusion depths are produced with a single oxide layer, the fabrication time for the completed device is decreased and fabrication costs are reduced. In addition, because fewer fabrication steps are required, the junction depths are less subject to shifts resulting from dopant migration during processing steps. In addition, the non-growth environment preserves the original shape of the wafer surface (generally flat), allowing for easier fabrication of additional device elements in later steps.

BRIEF DESCRIPTION OF THE DRAWINGS

The foregoing and other features of the present invention will be readily understood from the following detailed description of the preferred embodiment taken in conjunction with the accompanying drawings wherein.

DETAILED DESCRIPTION OF THE PREFERRED EMBODIMENTS

The method according to the present invention will now be discussed using a generalized example and with reference to FIGS. 1a through 1d. The method will then be discussed with particular reference to zinc-doped InGaAs and InP wafers arranged in a manner suitable for the fabrication of opto-electronic components, such as semiconductor lasers and modulator circuits. Those of skill in the art will recognize that the present method may be applied to other types of semiconductor and non-semiconductor materials which are fabricated in a similar manner. In addition, the present invention may be suitable for fabrication of devices using less conventional methods, such as thin film fabrication.

Figure 1A:
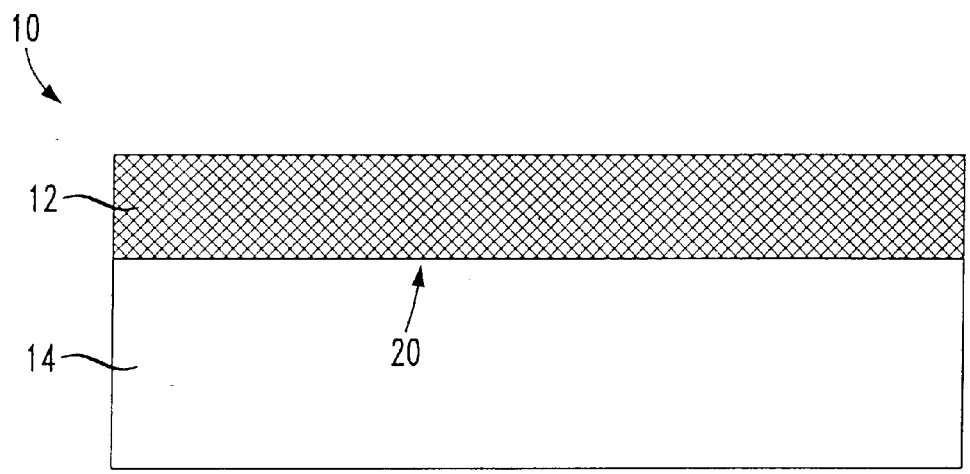
FIGS. 1a through 1d are substrate cross-sections illustrating the various processing steps of the present method.
Figure 1B:
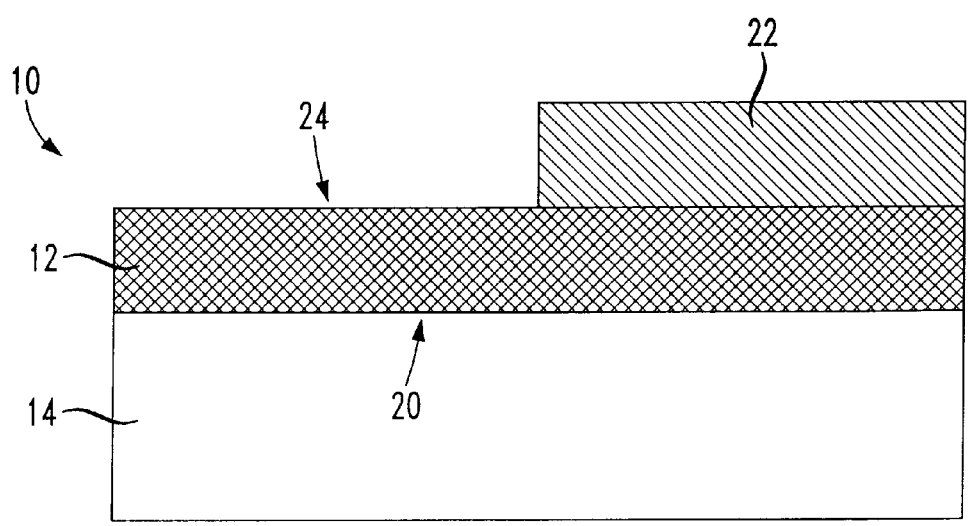

Turning to FIG. 1a, there is shown a cross-section of an idealized semiconductor wafer 10 which has an upper doped layer 12 over a lower undoped or low doped sub-region 14. The intersection between the doped layer 12 and the adjacent low or undoped sub-region 14 defines a dopant front profile 20, which is an indication of where the low or undoped area begins, and thus the junction depth. As shown in FIG. 1b, after the initial wafer 10 with the desired starting diffusion front profile 20 is formed, an oxide layer 22 is selectively grown over the portions of the wafer 10 on which shallowest junction devices will be formed. The uncovered regions 24 include the areas in which an increased junction depth is required.

Various methods are available for growing an oxide layer over selected portions of the surface of a wafer. Such methods are well-known to those skilled in the art and can vary according to the specific materials involved.

Figure 1C:
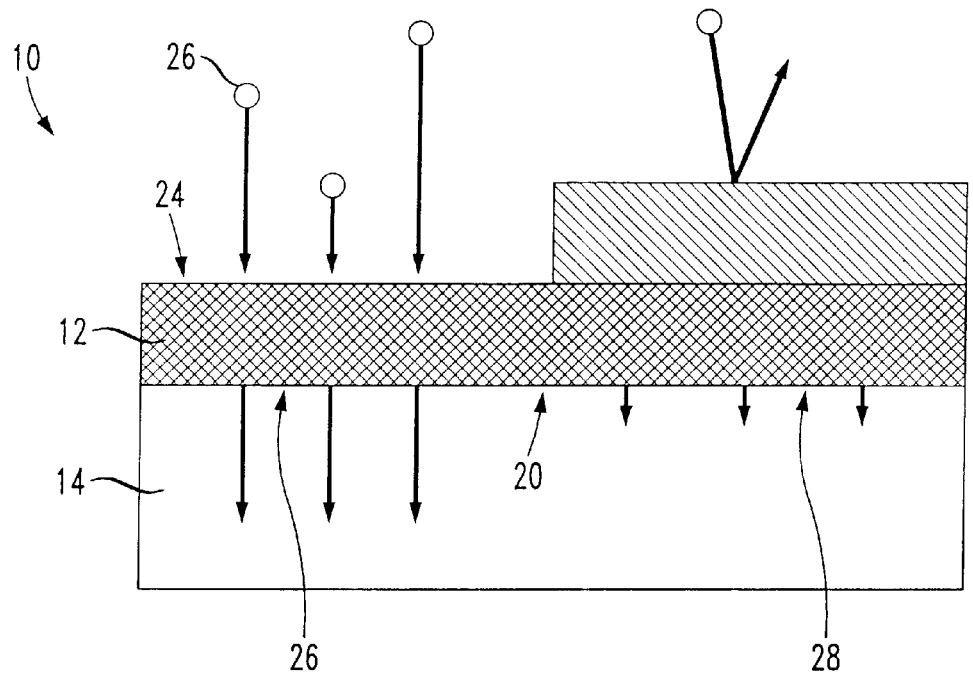

Once the oxide layer 22 is selectively deposited on portions of the surface of the wafer 10, the wafer is exposed to a substantially non-growth enhancement diffusion environment for a pre-determined amount of time. As illustrated in FIG. 1C, this environment contains the dopant 26 at a pre-defined flow rate. However, the environment does not contain elements which would cause growth of additional layers on the exposed surface. Preferably, the enhancement environment is similar to the growth environment used to deposit layer 12, but with the non-dopant material sources disabled so as to prevent growth. The enhancement environment may also include additional components to prevent outgassing of elements from the exposed surface 24 of the wafer, if necessary. Because material is not grown on the exposed surface 24 of the wafer, the original surface characteristics of the wafer are substantially preserved.

As graphically illustrated in FIG. 1c, the rate at which the dopant front profile advances, i.e., the rate at which the dopants diffuse from the doped layer 12 into the low or undoped sub-layer 14, depends upon the flow rate of the dopants in the enhancement environment. For certain doping materials, the rate of diffusion when dopants are present in such an enhancement diffusion environment, is substantially greater than the diffusion rate when dopants are absent, i.e., when only thermal diffusion is present.

Figure 1D:
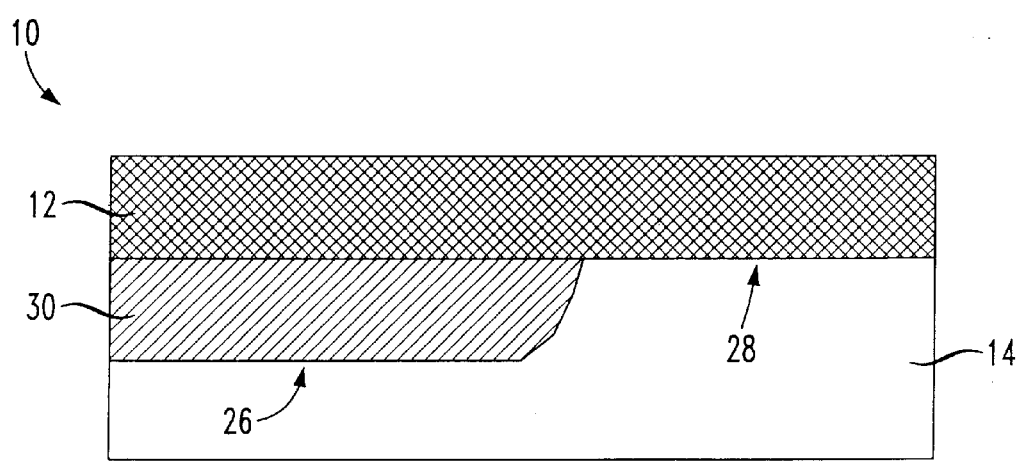

The wafer is exposed to the non-growth enhancement diffusion environment for a sufficiently long amount of time to allow the dopant front profile 26, which is under the exposed portion 24 of the wafer 10, to advance to the desired depth (FIGS. 1c, 1d). The portion 28 of the dopant front profile which is under the oxide layer 22 advances a only small degree due to thermal diffusion since the enhancement environment dopants cannot penetrate the oxide 22. Thus, it is apparent that the oxide layer 22 must be thick enough prevent significant diffusion.

After the desired profile modification is obtained, the oxide layer 22 is removed. The final wafer 10, as illustrated in FIG. 1d, retains the original surface characteristics and also includes an additional diffusion region 30 which extends into the sub-layer 14 and a correspondingly deeper dopant front profile region 26. The depth to which the dopants advance in the uncovered regions of the wafer depends on the composition of the enhancement environment, the temperature, and the duration of exposure.

The rate at which the diffusion of dopants in the wafer is enhanced is dependent on the composition of the wafer, the dopant, and its concentration in the enhancement environment, as well as other environmental factors, such as temperature and pressure. The speed at which diffusion is increased can be characterized as an enhancement factor, which is a multiplier that indicates the rate of diffusion of the dopant in the wafer relative to the diffusion rate due only to thermal diffusion. The enhancement factor when no additional dopants are introduced from the environment is 1, since only thermal diffusion occurs.

Figure 2:
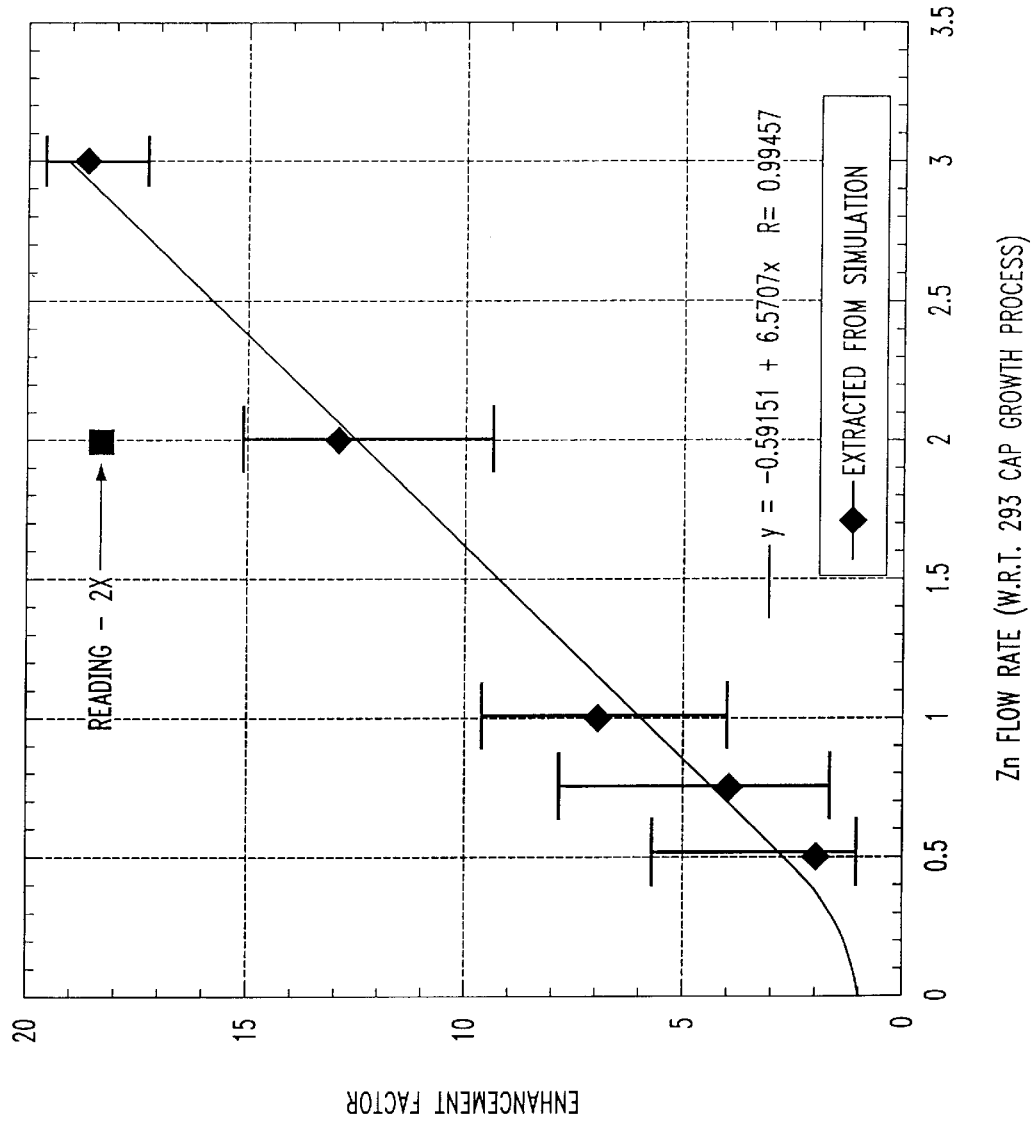
FIG. 2 is a graph of the zinc diffusion enhancement factor as a function of zinc flow rate for a representative fabrication process.

Turning to FIG. 2, there is shown a graph of the diffusion enhancement factor for zinc in an InGaAs/InP wafer as a function of the zinc flow rate. The flow rate is measured in multiples of the zinc flow rate during a standard diffusion step in a given fabrication process. In this example, the modeled enhancement environment has a temperature of substantially 650° C. and a pressure of substantially 60 Torr. A flow rate of one corresponds to a zinc dopant concentration of approximately $7*10^{18}$ atoms/cm$^3$. A flow rate of three is three times the unity flow rate, i.e., approximately, $2*10^{19}$ atoms/cm$^3$. As shown in the graph, with a flow rate of 1, the enhancement factor is approximately 7, meaning that the enhanced diffusion occurs at a rate 7 times that due to thermal diffusion alone. For a flow rate of 3, the enhancement factor is approximately 19. Thus, under these conditions and with reference to FIG. 1c, when the flow rate is three, the speed at which the portion 26 of the dopant front profile 20 advances is approximately 19 times the rate at which the portion 28 of the dopant front profile advances.

Although a wide variety of environmental factors can be adjusted during the fabrication process, temperature and pressure in particular, a processing temperature of 650° C. has been determined unexpectedly to best preserve the original characteristics of the surface cap layer while providing an acceptable diffusion rate. Significantly lower temperatures introduce defects in the surface, which defects provide a path for dopants to enter the wafer, thus increasing the diffusion rate. Significantly higher temperatures increase the rate of undesirable thermal diffusion, making it more difficult to preserve the original doping concentration curve in areas under the oxide.

The high dependence of the zinc diffusion enhancement factor on the zinc flow rate for an InGaAs/InP wafer allows for a relatively large shift in the dopant front profile in the non-oxide region without a substantial change in the original (covered) dopant profile. This allows accurate positioning of p/n junctions at different depths on the same wafer while preserving the surface characteristics. Thus, separate classes of devices which require different p/n junction depths, such as semiconductor laser and electronic modulator circuits, can be fabricated on the same wafer and thus combined on the same chip. Furthermore, because the diffusion rate is dependent on the dopant flow rate in the enhancement environment, which is easily controlled, the enhanced diffusion rate can also be controlled as needed to provide an appropriate diffusion rate differential (between enhanced diffusion and thermal diffusion) for a given design requirement.

Figure 3A:
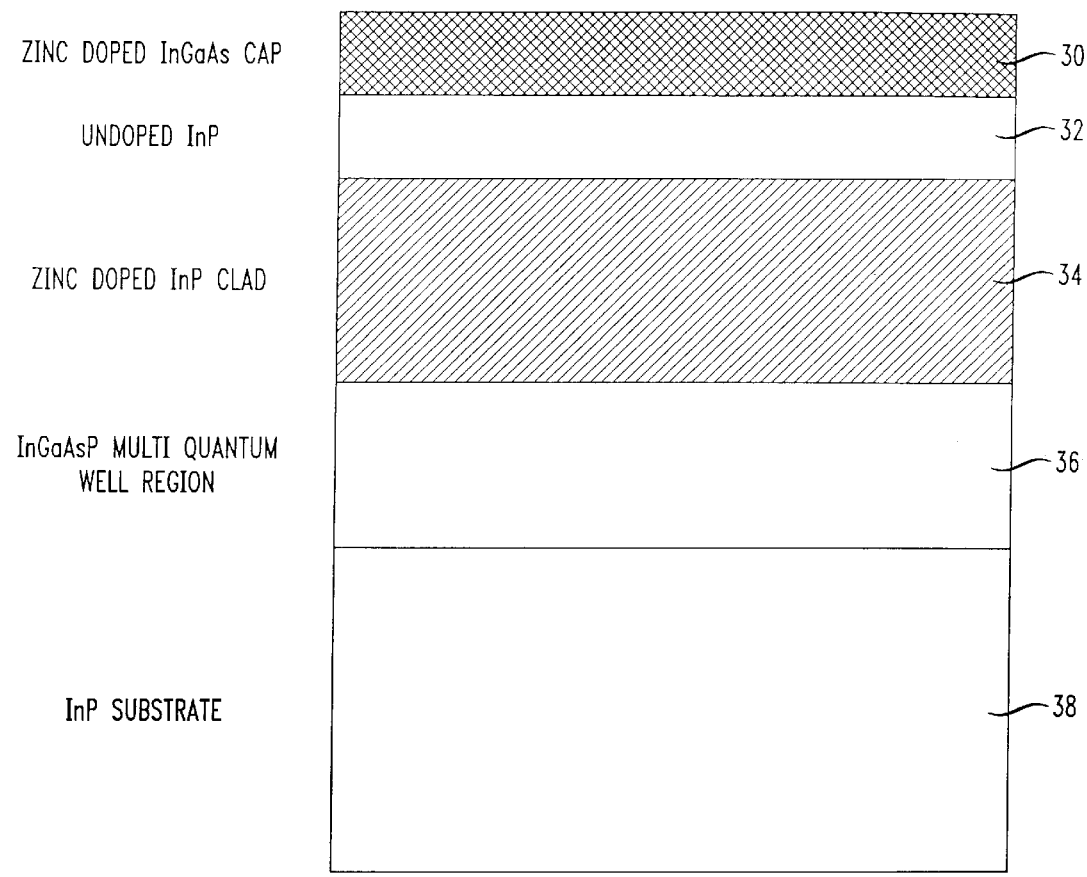
FIGS. 3a and 3b are cross-sections of a sample wafer structure before and after selective area diffusion, respectively.

Turning to FIG. 3a, there is shown a cross section of an initial wafer 10' which is suitable for the fabrication of opto-electronic devices. The wafer 10' has an upper cap layer 30 comprised of InGaAs with a zinc doping concentration of $1*10^{19}$ and having a thickness of approximately 0.5 microns. The cap layer 30 sits over a low or substantially undoped InP layer 14 with a thickness of approximately 0.5 microns. Next is a zinc doped InP clad layer 34 with a zinc doping concentration of about $1*10^{18}$ and a thickness of approximately 1.25 microns. Beneath the clad layer 34 is a multi quantum well region 36 comprised of InGaAsP. This layer is undoped but is generally configured to form a second confinement layer and a multi-quantum well region. The lowest layer 38 is an undoped InP substrate.

With particular reference to semiconductor laser/modulator devices fabricated using zinc doped InGaAs and InP, the modulators components require a shallow junction, extending only into the second confinement layer (i.e., the top portion of layer 36 in FIG. 3a), while the semiconductor laser needs a deeper diffusion which places the junction point in the quantum well and the confinement layer 36. Preferably, the position of the dopants in the original wafer 10 correspond to the shallowest junction depth required for devices to be fabricated on the wafer, since the method according to the invention will increase the depth of the junction in selected areas on the wafer. More preferably, the initial profile is slightly shallower/narrower than required to compensate for thermal diffusion during processing.

In an experimental process, a wafer 10' such as shown in FIG. 3a was fabricated using the selective area diffusion control process according to the invention. An oxide layer 22' (shown in dotted line in FIG. 3b) having a thickness of approximately 5000 Å was grown using conventional techniques over a portion of the wafer and the uncovered region was exposed to the non-growth diffusion enhancement environment. The non-growth diffusion enhancement environment had a preferred temperature of substantially 650° C. and a pressure of substantially 60 Torr. Zinc dopants were provided at a preferable flow rate of three (i.e., approximately $2.1*10^{19}$ atoms/cm$^3$). Indium and gallium were excluded from the diffusion environment to prevent the growth of material on the upper InGaAs cap layer 30. In addition, AsH$_3$ was preferably included in the environment at a sufficient concentration to prevent outgassing of As from the cap layer, thus better preserving the initial surface conditions of the wafer 10'. Most preferably for this wafer configuration, the AsH$_3$ was present at a flow rate of approximately 99.87 sccm (standard cubic centimeters per minute). The wafer 10' was exposed to this non-growth enhanced diffusion environment for approximately 30 minutes and then the oxide layer was removed.

Figure 3B:
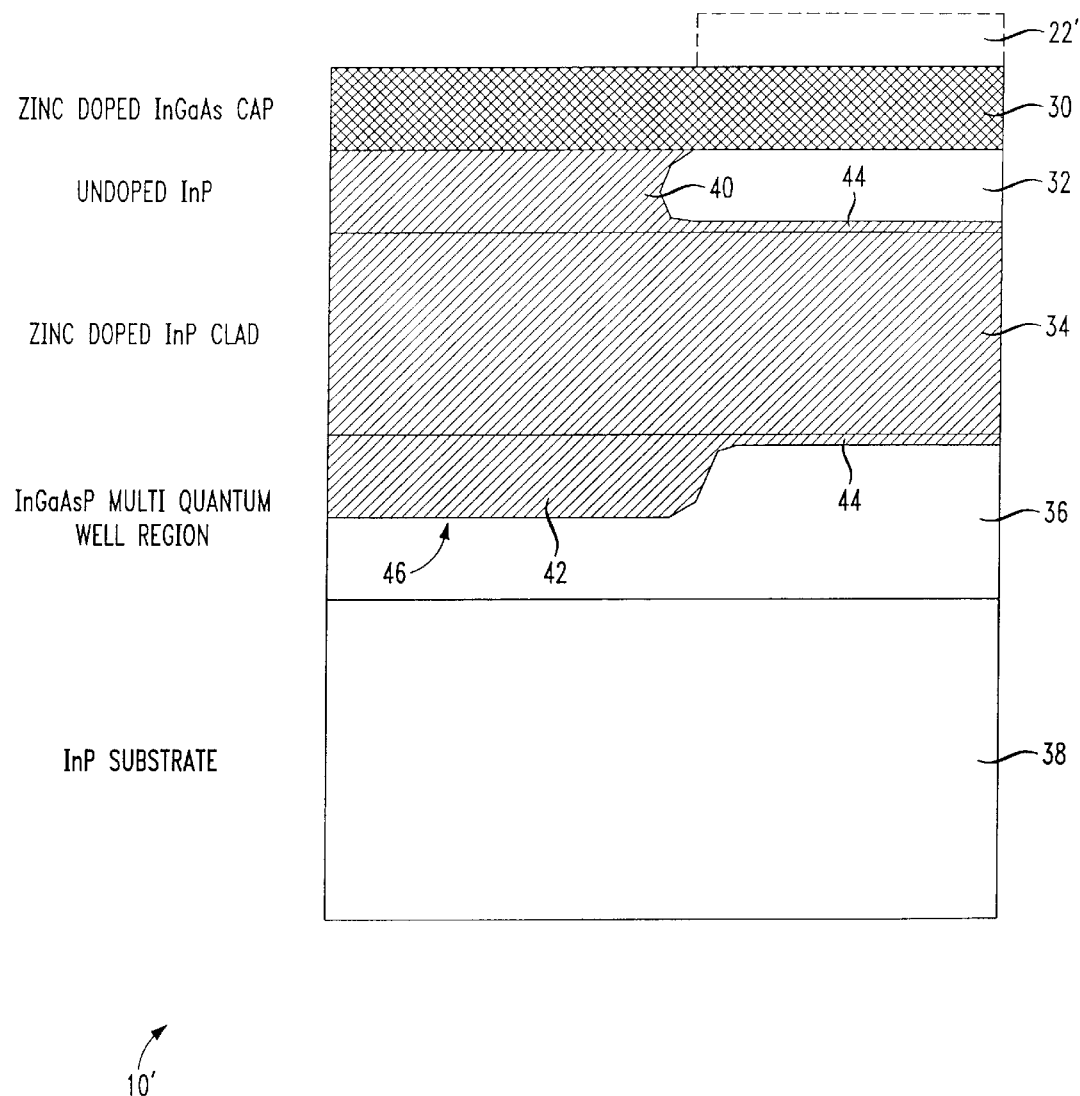
Figure 3C:
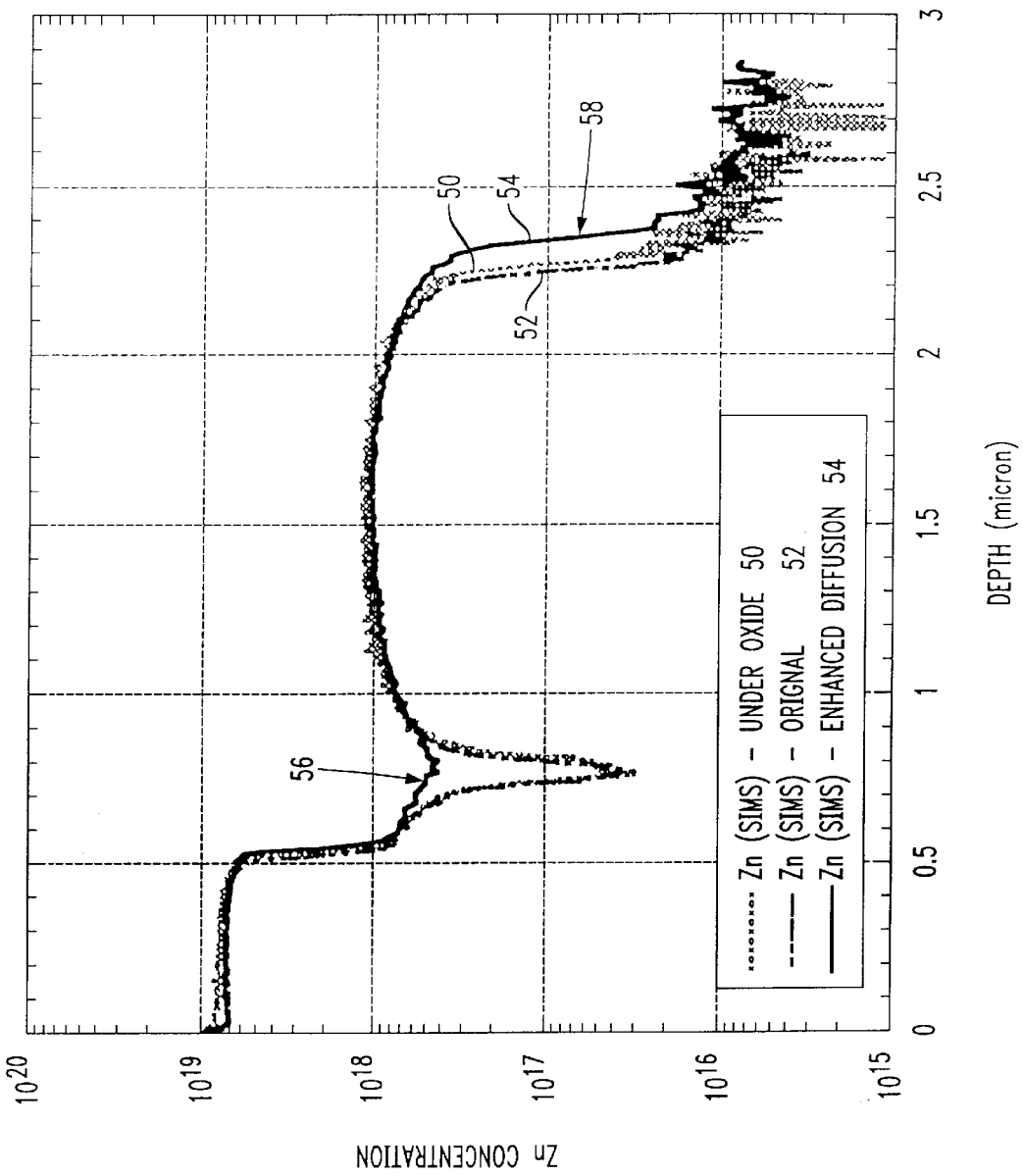
FIG. 3c is a graph of the dopant density for the wafer of FIGS. 3a and 3b.

A cross section of the wafer 10' showing the relative dopant positions after the above-described enhanced diffusion control process is illustrated in FIG. 3b. A corresponding graph of the doping concentration by depth is shown in FIG. 3c, where curve 52 indicates the original doping concentrations, curve 54 indicates the doping concentrations after enhancement diffusion, and curve 50 indicates the doping concentrations in the region covered by the oxide layer.

During the enhanced diffusion process, zinc atoms enter those areas of the cap layer which are not covered by the oxide, causing conventional diffusion of the cap layer 30 downward into the undoped layer 32. Some of the zinc atoms which diffuse from the cap layer 30 into layer 32 travel quickly through the interstitial sites formed by defects in the InP crystalline lattice of layer 32 and enter the clad layer 34.

The flow of zinc atoms into the clad layer 34 creates an additional enhanced diffusion environment within the wafer 10', enhancing diffusion of dopants from the clad region 34 both upwards (into the undoped layer 32) and downwards into the multi quantum well region 36. In a sufficiently long diffusion process, the downward diffusion of the cap layer 30 and the upward diffusion of the clad layer 34 meet to form a medium doped region 40 in the previously undoped layer 32. This "filling in" of the upper undoped layer is shown in region 56 of the curves of FIG. 3c. The downward diffusion of the cap layer 30 creates an additional diffusion region 42 in layer 36, thus pushing the dopant front profile 46 downward into the multi quantum well region. A controlled shift of the dopant front profile by more than 0.1 microns is clearly discernable on curve 54 at region 58 of FIG. 3c.

As shown by curve 50, the doping profile in regions of the wafer covered by the oxide remain substantially unchanged, although there is some degree of thermal diffusion. In particular, dopants from the clad region 34 diffuse a small amount upwards and downwards, as illustrated by regions 44 in FIG. 3b. This thermal diffusion is also visible as a small shift in the doping density curve 50 in region 58 of FIG. 3c. For most applications, this small shift is of minor consequence.

The selective area diffusion control method according to the invention provides the ability to adjust the rate of advance of the diffusion front very precisely by varying the dopant flow rate and thereby allowing placement of the junction at the desired point in the wafer. With particular reference to opto-electronic devices, the present invention permits the proper p/n junction depths for a semiconductor laser and for the electronic components of a laser modulator to be formed on the same wafer, thus permitting the fabrication of opto-electronic laser devices on a single chip.

While the present invention has been particularly shown and described with reference to preferred embodiments thereof, it will be understood by those skilled in the art that various changes in form and details may be made therein without departing from the spirit and scope of the invention. In particular, while the method has been discussed with particular reference to zinc doped InGaAs/InP wafers configured for opto-electronic devices, the method can be applied to wafers having other substrate configurations and different dopants.

We claim:

1. A method for altering a dopant front profile in a wafer for a particular dopant comprising the steps of:

(a) providing a wafer comprising at least a first layer containing the dopant at a first concentration and a second layer having a lower concentration of the dopant, a boundary between the first and second layers forming the dopant front;

(b) forming an oxide layer over a first portion of said first layer while leaving a second portion of said first layer oxide-free;

(c) exposing said wafer to an enhancement diffusion environment containing said dopant at a predefined flow rate for a predetermined period of time, the flow rate selected to produce a diffusion enhancement factor of approximately greater than seven; and (d) removing said oxide layer.

2. The method of claim 1, wherein said first layer comprises InGaAs, said second layer comprises InP, and said dopant comprises zinc.

3. The method of claim 2, further comprising the step of depositing the first layer using a growth environment having sources of gallium, indium, and zinc;

wherein said enhancement diffusion environment is a non-growth enhancement diffusion environment comprising zinc and having the sources of gallium and indium disabled.

4. The method of claim 3, wherein said non-growth enhancement diffusion environment has a temperature of approximately 650° C.

5. The method of claim 4, wherein said non-growth enhancement diffusion environment has a pressure of approximately 60 Torr.

6. The method of claim 3, wherein said non-growth enhancement diffusion environment further comprises $AsH_3$ at a sufficient flow rate to reduce diffusion of As from the second portion of said first layer.

7. The method of claim 6, wherein said $AsH_3$ flow rate is approximately 99.87 standard cubic centimeters per second.

8. A method for altering a dopant front profile in a semiconductor wafer to provide a first p/n junction at a first depth in a first region of the wafer and a second p/n junction at a second depth shallower than the first depth in a second region of the wafer, said method comprising the steps of:

(a) providing a wafer comprising a first layer of InGaAs with a first zinc doping concentration, a second layer of InP below the top layer with a second zinc doping concentration, a third layer of InP below the second layer with a third zinc doping concentration, and a fourth layer of InGaAsP below the third layer with a fourth zinc doping concentration, the third doping concentration being less than the first doping concentration, the second and fourth doping concentrations being less than the third concentration, the fourth layer configured to form a confinement layer and a multi-quantum well region, a boundary between the third and fourth layers forming the dopant front;

(b) growing an oxide layer over the second region of the wafer while leaving the first region of the wafer oxide-free;

(c) exposing said wafer to an enhancement diffusion environment for a predetermined period of time, said environment containing zinc and $AsH_3$ at a predetermined flow rates selected to produce a diffusion enhancement factor of approximately greater than seven; and (d) removing said oxide layer.

9. The method of claim 8, wherein said non-growth enhancement diffusion environment has a temperature of substantially 650° C. and a pressure of substantially 60 Torr.

10. The method of claim 9, wherein said $AsH_3$ concentration is approximately 99.87 standard cubic centimeters per second.

11. The method of claim 10, wherein:

said first doping concentration is substantially $1*10^{19}$ atoms per cubic centimeter and said first layer has a thickness of approximately 0.5 microns;

said second layer has a thickness of approximately 0.5 microns; and said third doping concentration is substantially $1*10^{18}$ atoms per cubic centimeter and said third layer has a thickness of approximately 1.25 microns;

said first, second, third, and fourth layers being contiguous.

* * * * *